(12) United States Patent
Lin et al.

(10) Patent No.: US 10,710,936 B2
(45) Date of Patent: Jul. 14, 2020

(54) CERAMIC SUBSTRATE AND ITS MANUFACTURING METHOD, POWER MODULE

(71) Applicant: BYD COMPANY LIMITED, Shenzhen, Guangdong (CN)

(72) Inventors: Yongzhao Lin, Shenzhen (CN); Xinping Lin, Shenzhen (CN)

(73) Assignee: BYD COMPANY LIMITED, Shenzhen (CN)

(*) Notice: Subject to any disclaimer, the term of this patent is extended or adjusted under 35 U.S.C. 154(b) by 552 days.

(21) Appl. No.: 15/432,608

(22) Filed: Feb. 14, 2017

(65) Prior Publication Data

US 2017/0152192 A1    Jun. 1, 2017

Related U.S. Application Data

(63) Continuation of application No. PCT/CN2015/084976, filed on Jul. 23, 2015.

(30) Foreign Application Priority Data

Aug. 28, 2014   (CN) .......................... 2014 1 0430706
Aug. 28, 2014   (CN) .......................... 2014 1 0430707

(51) Int. Cl.
  *B32B 9/00*       (2006.01)
  *C04B 37/00*      (2006.01)
  (Continued)

(52) U.S. Cl.
  CPC ............ *C04B 37/001* (2013.01); *B32B 18/00* (2013.01); *C04B 35/10* (2013.01); *C04B 35/119* (2013.01);
  (Continued)

(58) Field of Classification Search
  CPC ................................ C01B 31/04; B82Y 30/00
  (Continued)

(56) References Cited

U.S. PATENT DOCUMENTS 4,303,480 A * 12/1981 Wood ....................... C25D 5/02
                                                    205/125
4,595,663 A    6/1986 Krohn
(Continued)

FOREIGN PATENT DOCUMENTS

CN     1460661 A     12/2003
CN     1533999 A     10/2004
(Continued)

OTHER PUBLICATIONS

International Search Report and Written Opinion for Application No. PCT/CN2015/084976, dated Oct. 28, 2015, 11 pages.
(Continued)

*Primary Examiner* — Daniel H Miller

(57) ABSTRACT

Provided is a ceramic substrate. The ceramic substrate includes a core layer, made of zirconia toughened alumina; and surface layers, symmetrically located on an upper and a lower surfaces of the core layer, made of $Al_2O_3$. The core layer has a chemical composition of 0 wt %<$ZrO_2$≤40 wt % and 60 wt %≤$Al_2O_3$<100 wt %. A method for manufacturing the ceramic substrate and a power module including the ceramic substrate are also provided.

12 Claims, 3 Drawing Sheets

(51) Int. Cl.
*B32B 18/00* (2006.01)
*H01L 23/15* (2006.01)
*C04B 35/119* (2006.01)
*C04B 35/634* (2006.01)
*C04B 35/626* (2006.01)
*C04B 35/632* (2006.01)
*C04B 37/02* (2006.01)
*C04B 35/10* (2006.01)
*C04B 35/638* (2006.01)
*C04B 35/645* (2006.01)
*H01L 21/48* (2006.01)
*H01L 23/373* (2006.01)

(52) U.S. Cl.
CPC ...... *C04B 35/6261* (2013.01); *C04B 35/6264* (2013.01); *C04B 35/632* (2013.01); *C04B 35/634* (2013.01); *C04B 35/638* (2013.01); *C04B 35/6342* (2013.01); *C04B 35/63416* (2013.01); *C04B 35/6455* (2013.01); *C04B 37/021* (2013.01); *C04B 37/025* (2013.01); *H01L 21/4871* (2013.01); *H01L 23/15* (2013.01); *H01L 23/3735* (2013.01); *C04B 2235/3217* (2013.01); *C04B 2235/3244* (2013.01); *C04B 2235/604* (2013.01); *C04B 2235/606* (2013.01); *C04B 2235/6025* (2013.01); *C04B 2235/6562* (2013.01); *C04B 2235/6565* (2013.01); *C04B 2235/77* (2013.01); *C04B 2235/96* (2013.01); *C04B 2237/343* (2013.01); *C04B 2237/348* (2013.01); *C04B 2237/58* (2013.01); *C04B 2237/704* (2013.01); *C04B 2237/72* (2013.01); *H01L 2924/0002* (2013.01)

(58) Field of Classification Search
USPC .......................................................... 428/408
See application file for complete search history.

(56) References Cited

U.S. PATENT DOCUMENTS 5,032,555 A * 7/1991 Yamanis ............... C01F 7/36
264/13
5,786,097 A * 7/1998 Scanlan ................ C04B 37/025
204/192.15
2004/0023047 A1 2/2004 O'Donnell
2004/0102023 A1 * 5/2004 Morozumi .......... H01L 23/3735
438/460
2005/0187638 A1 8/2005 Glien
2013/0084189 A1 4/2013 Diego

FOREIGN PATENT DOCUMENTS

| CN | 1684720 A | 10/2005 |
| CN | 101244944 A | 8/2008 |
| CN | 101928156 A | 12/2010 |
| CN | 102501548 A | 6/2012 |
| CN | 102718470 A | 10/2012 |
| CN | 102745995 A | 10/2012 |
| CN | 103030416 A | 4/2013 |
| CN | 103408291 A | 11/2013 |
| DE | 102004012231 A1 | 9/2005 |
| EP | 0727818 A1 | 8/1996 |
| EP | 1631132 A2 | 3/2006 |
| JP | S6270041 A | 3/1987 |
| JP | S62148258 A | 7/1987 |
| JP | H0738014 A | 2/1995 |
| JP | H09110561 A | 4/1997 |
| JP | 2003327475 A | 11/2003 |
| JP | 2013252978 A | 12/2013 |
| JP | 2014090049 A | 5/2014 |

OTHER PUBLICATIONS

Ambrozic, Milan et al., "Optimization of the Bend Strength of Flat-Layered Alumina-Zirconia Composites," Journal of the American Ceramic Society, vol. 90, No. 5, pp. 1545-1550, May 2007.

Barnett-Ritcey, Dwayne D. et al., "Failure Prediction Maps for a Model Al(2)O(3)/c—ZrO(2)/Al(2)O(3)/Al(2)O(3) Brittle Polycrystalline Trilayer Composite," Journal of the American Ceramic Society, pp. 121-128, vol. 86, No. 1, Jan. 2003.

Beranic Klopcic, Sabina et al., "The Preparation and Properties of Functionally Graded Alumina/Zirconia-Toughened Alumina (ZTA) Ceramics for Biomedical Applications," Key Engineering Materials, vol. 290, pp. 348-352, Jul. 15, 2005.

Boch, Philippe et al., "Tape Casting of Al2O3/ZrO2 Laminated Composites," Journal of the American Ceramic Society, vol. 69, No. 8, pp. 191-192, Aug. 1986.

Zhou, Zehua, "Study on Properties of ZrO2—Al2O3 Laminated 1-21 Ceramics," (abstract), Chinese Doctoral Dissertations & Master's Theses Full-text Database (Doctor), Engineering Science and Technology 1, Jun. 15, 2003.

* cited by examiner

CERAMIC SUBSTRATE AND ITS MANUFACTURING METHOD, POWER MODULE

CROSS-REFERENCE TO RELATED APPLICATION

This application is a continuation application of International Application No. PCT/CN2015/084976, filed on Jul. 23, 2015, which is based on and claims priority to and benefits of Chinese Patent Applications No. 201410430707.6 and No. 201410430706.1, both filed with the State Intellectual Property Office (SIPO) of the People's Republic of China on Aug. 28, 2014. The entire contents of the above-referenced applications are incorporated herein by reference.

FIELD

Embodiments of the disclosure generally relate to the field of a power module, and more particularly to a ceramic substrate and its manufacturing method, as well as a power module including the ceramic substrate.

BACKGROUND

With the rapid development of high-tech nowadays, it requires a substrate used in an electronic device with a high performance, high reliability and high density being made of a material with an excellent mechanical property, electrical property, thermal property and weldability. An essential assembly used in a power module is a direct bonded copper (short for DBC) substrate made of a metal-ceramic composite, which shows main features including high dielectric strength, current carrying capacity, and high thermal conductivity. Ceramics used in DBC substrate generally includes AlN, $Al_2O_3$ and BeO, which performance and thickness can be seen in following Table 1.

TABLE 1

| Material | Bending strength/MPa | Thermal conductivity/W/m · K | Thickness/mm |
| --- | --- | --- | --- |
| AlN | 200-300 | 140-270 (320 in theory) | 0.635 |
| $Al_2O_3$ | 200-400 | 20-30 | 0.38 |
| BeO | — | 300 | — |

It can be seen from Table 1 that, ceramic substrate made of AlN shows lower bending strength (200~300 MPa), and the thickness may reach 0.635 mm when used in current IGBT power module. In addition, the production condition for ceramic substrate made of AlN is terribly harsh, together with high cost. Thus just a few companies, e.g. Maruwa and Kyocera, are capable of producing such ceramic substrate made of AlN. Otherwise, the thickness of the ceramic substrate made of $Al_2O_3$ may reach 0.38 mm, which greatly decreases the size thereof. But while using it in power module, the overall thermal resistance remains high, which causes the difficulty for heat radiation, and the fast speed of temperature rising. While using BeO for producing electronic packaging materials, the integrated performance is much better, but a poisonous property thereof limits its application.

SUMMARY

In viewing thereof, the present disclosure is directed to solve at least one problem existing in the art of the ceramics used in a DBC substrate, for example, high cost, high thermal resistance and poisonous property.

Embodiments of one aspect of the present disclosure provide a ceramic substrate. The ceramic substrate includes: a core layer, made of zirconia toughened alumina; and a plurality of surface layers, symmetrically located on an upper and a lower surfaces of the core layer, and made of $Al_2O_3$. The core layer has a chemical composition of: 0 wt %<$ZrO_2$≤40 wt %, 60 wt %≤$Al_2O_3$<100 wt %.

In some embodiments, the core layer has the chemical composition of 0 wt %<$ZrO_2$≤20 wt % and 80 wt %≤$Al_2O_3$<100 wt %.

In some embodiments, the plurality of surface layers include: an upper surface layer, located on the upper surface of the core layer; and a lower surface layer, located on the lower surface of the core layer. Each of the upper surface layer, the lower surface layer, and the core layer has a same thickness.

In some embodiments, the ceramic substrate has a total thickness of about 0.2 mm to about 0.4 mm.

In some embodiments, the ceramic substrate further includes a plurality of transition layers made of zirconia toughened alumina. The plurality of transition layers are symmetrically located on the upper and lower surfaces of the core layer, and each of the transition layers is located between one surface layer and the core layer. Each of the transition layers has a content of zirconia less than the core layer.

In some embodiments, the core layer has the chemical composition of 10 wt %<$ZrO_2$≤20 wt % and 80 wt %≤$Al_2O_3$<90 wt %. Each of the transition layers has a chemical composition of 0 wt %<$ZrO_2$≤10 wt % and 90 wt %≤$Al_2O_3$<100 wt %.

In some embodiments, the core layer has the chemical composition of 20 wt %<$ZrO_2$≤40 wt % and 60 wt %≤$Al_2O_3$<80 wt %. Each of the transition layers has a chemical composition of 10 wt %<$ZrO_2$≤20 wt % and 80 wt %≤$Al_2O_3$<90 wt %.

In some embodiments, the plurality of transition layers include: an upper transition layer, located between the core layer and the upper surface layer; and a lower transition layer, located between the core layer and the lower surface layer. Each of the upper transition layer, the lower transition layer, the upper surface layer, the lower surface layer and the core layer has a same thickness.

In some embodiments, the plurality of transition layers include: a first upper transition layer, located on the upper surface of the core layer; a second upper transition layer, located between the first upper transition layer and the upper surface layer; a first lower transition layer, located on the lower surface of the core layer; and a second lower transition layer, located between the first lower transition layer and the lower surface layer. The second upper transition layer has a content of zirconia less than the first upper transition layer, and the second lower transition layer has a content of zirconia less than the first lower transition layer.

In some embodiments, each of the second upper transition layer and the second lower transition layer has a same chemical composition of 0 wt %<$ZrO_2$≤10 wt % and 90 wt %≤$Al_2O_3$<100 wt %. Each of the first upper transition layer and the first lower transition layer has a same chemical composition of 10 wt %<$ZrO_2$≤20 wt % and 80 wt %≤$Al_2O_3$<90 wt %. The core layer has the chemical composition of 20 wt %<$ZrO_2$≤40 wt %, 60 wt %≤$Al_2O_3$<80 wt %.

In some embodiments, each of the first upper transition layer, the second upper transition layer, the first lower transition layer, the second lower transition layer, the upper surface layer, the lower surface layer and the core layer has a same thickness.

Embodiments of another aspect of the present disclosure provide a method for manufacturing the above-mentioned ceramic substrate, including steps of: providing a green body of the core layer and a plurality of green bodies of the surface layers, stacking all of the green bodies according to an order of: surface layer-core layer-surface layer, isostatic pressing, then debinding and sintering.

In some embodiments, the step of providing all green bodies is performed by tape casting.

In some embodiments, the green body of the core layer is manufactured with a first ceramic slurry containing zirconia, aluminia, a binder, a dispersant, a plasticizer, and a solvent. The plurality of green bodies of the surface layers are manufactured with a second ceramic slurry containing alumina, a binder, a dispersant, a plasticizer and a solvent.

In some embodiments, the method further includes: providing a plurality of green bodies of transition layers, stacking all of the green bodies according to an order of: surface layer-transition layer-core layer-transition layer-surface layer, isostatic pressing, then debinding and sintering.

In some embodiments, the plurality of green bodies of the transition layers are manufactured with a third ceramic slurry containing zirconia, alumina, a binder, a dispersant, a plasticizer and a solvent.

In some embodiments, the binder used in each ceramic slurry is independently at least one selected from a group consisting of polyvinyl butyral and polyvinyl alcohol.

In some embodiments, the dispersant used in each ceramic slurry is independently at least one selected from a group consisting of castor oil, triolein, phosphate esters, menhaden oil and triethanolamine.

In some embodiments, the plasticizer used in each ceramic slurry is independently at least one selected from a group consisting of dibutyl phthalate, polyethylene glycol and glycerol.

In some embodiments, the solvent used in each ceramic slurry is independently at least one selected from a group consisting of toluene, xylene, ethanol and butanone.

Embodiments of a further aspect of the present disclosure provide a power module. The power module includes a direct bonded copper substrate, and the direct bonded copper substrate including: a ceramic substrate; and a metal layer, located on a surface of the ceramic substrate. The ceramic substrate is the above-mentioned ceramic substrate or obtained by the aforementioned method.

The ceramic substrate according to embodiments of the present disclosure, including a core layer made of zirconia toughened alumina (short for $ZrO_2$—$Al_2O_3$) and a plurality of surface layers made of $Al_2O_3$, on one hand may take advantage of high thermal conductivity of ceramics of $Al_2O_3$, and high strength and high toughness of ceramics of $ZrO_2$—$Al_2O_3$. On the other hand, the ceramic substrate disclosed herein has a content of zirconia increasing from the surface layer to the core layer, thus the sintering shrinkage thereof may increase correspondingly, which may improve the density of the ceramic substrate and further lead to the high strength and high toughness of the ceramic substrate. Meanwhile, the ceramic substrate according to embodiments of the present disclosure is nontoxic, which can be widely used in the power module.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the present disclosure will become apparent and more readily appreciated from the following descriptions taken in conjunction with the drawings, in which.

DETAILED DESCRIPTION

Reference will be made in detail to embodiments of the present disclosure. The embodiments described herein with reference to the accompany drawings are explanatory and illustrative, which are used to generally understand the present disclosure. The embodiments shall not be construed to limit the present disclosure.

For the purpose of the present description and of the following claims, the definitions of the numerical ranges always include the extremes unless otherwise specified. In addition, terms such as "first" and "second" are used herein for purposes of description and are not intended to indicate or imply relative importance or significance.

The ceramic substrate according to embodiments of the present disclosure will be discussed below in details.

Figure 1:
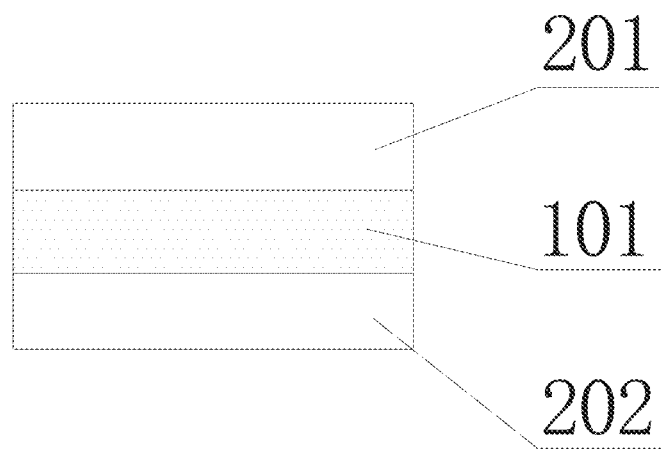
FIG. 1 is a schematic view showing a ceramic substrate according to an embodiment of the present disclosure.

According to an embodiment of the present disclosure, which can be seen in FIG. 1, the ceramic substrate includes a core layer 101, made of $ZrO_2$—$Al_2O_3$; and a plurality of surface layers, symmetrically located on an upper and a lower surfaces of the core layer 101, and made of $Al_2O_3$. The core layer has a chemical composition of 0 wt %<$ZrO_2$≤40 wt % and 60 wt %≤$Al_2O_3$<100 wt %.

The plurality of surface layers are symmetrically located on the upper and the lower surfaces of the core layer 101. In some embodiments, which can be seen in FIG. 1, the plurality of surface layers include an upper surface layer 201, located on the upper surface of the core layer 101; and a lower surface layer 202, located on the lower surface of the core layer 101.

In some embodiments, the thickness of the ceramic substrate decreases along with the increasing of the bending strength thereof. And the ceramic substrate according to the present disclosure, including a core layer made of $ZrO_2$—$Al_2O_3$ and a plurality of surface layers made of pure $Al_2O_3$, on one hand may take advantage of high thermal conductivity of ceramics of $Al_2O_3$, and high strength and high toughness of ceramics of $ZrO_2$—$Al_2O_3$. On the other hand, the ceramic substrate according to the present disclosure has a content of zirconia increasing from the surface layer to the core layer, thus the sintering shrinkage thereof may increase correspondingly, which may improve the density of the ceramic substrate and further ensure the high strength and high toughness of the ceramic substrate. Meanwhile, the ceramic substrate according to embodiments of the present disclosure is nontoxic, which can be widely used in the power module.

As mentioned above, the core layer 101 of the ceramic substrate is made of $ZrO_2$—$Al_2O_3$, and has the chemical composition of 0 wt %<$ZrO_2$≤40 wt % and 60 wt %≤$Al_2O_3$<100 wt %.

In some embodiments, the core layer 101 has the chemical composition of 0 wt %<$ZrO_2$≤20 wt % and 80 wt %≤$Al_2O_3$<100 wt %, so that the core layer 101 has just a little difference in the content of zirconia with the surface layers. Otherwise the difference of the sintering shrinkage of the ceramic substrate may be too large from the inside to the outside thereof, which may decrease the consistency of the ceramic substrate. In addition, the ceramics made of $ZrO_2$ has a thermal expansion coefficiency of about 11 ppm/° C., while the ceramics made of $Al_2O_3$ has a thermal expansion coefficiency of about 6 ppm/° C. Thus the ceramics made of $ZrO_2$—$Al_2O_3$ may have a thermal expansion coefficiency increasing along with the increasing of the content of the zorcina. Therefore, if the thermal expansion coefficiency of the core layer 101 is too different from the surface layers, there may be a hazard of thermal mismatch.

According to embodiments of the present disclosure, as mentioned above, the ceramic substrate includes the core layer 101 and the plurality of surface layers without any boundary therebetween, thus forming a complete integral ceramic substrate. In some embodiments, there is not any special limit to the thickness of the core layer 101 and the plurality of surface layers. In some embodiments, each of the upper surface layer 201, the lower surface layer 202 and the core layer 101 has a same thickness. In other embodiments, the thickness of the upper surface layer 201, the lower surface layer 202 and the core layer 101 may be different.

In some embodiments, the ceramic substrate further includes a plurality of transition layers made of $ZrO_2$—$Al_2O_3$, which are symmetrically located on the upper and lower surfaces of the core layer 101. Each of the transition layers is located between one surface layer and the core layer 101. The transition layer has a content of zirconia less than the core layer 101.

Figure 3:
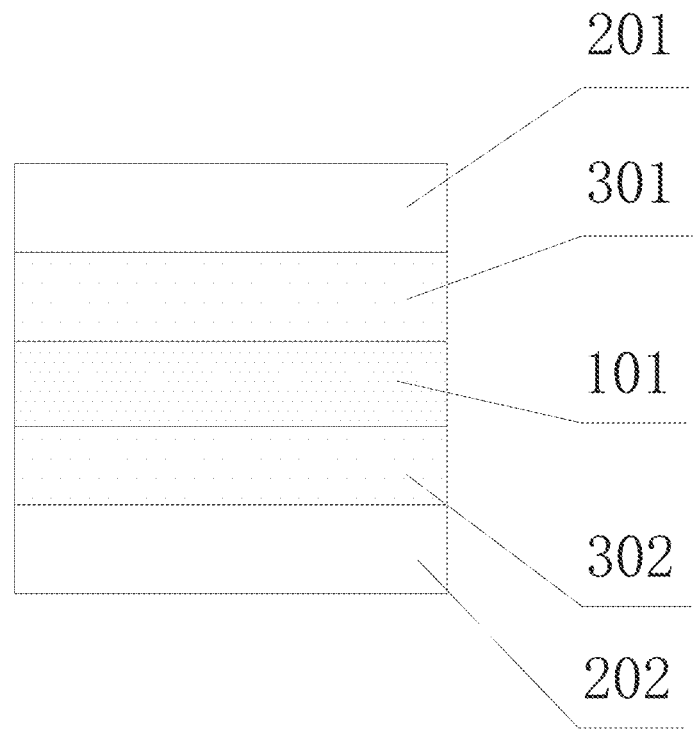
FIG. 3 is a schematic view showing the ceramic substrate S5 according to Embodiment 5 of the present disclosure.

In one embodiment, as can be seen in FIG. 3, the ceramic substrate includes, from inside to outside, a core layer 101, a plurality of transitions layers and a plurality of surface layers. The plurality of transition layers include an upper transition layer 301 and a lower transition layer 302. The plurality of surface layers include the upper surface layer 201 and the lower surface layer 202. The upper transition layer 301 is located between the core layer 101 and the upper surface layer 201, and the lower transition layer 302 is located between the core layer 101 and the lower surface layer 202. The surface layer is made of $Al_2O_3$, and each of the transition layers and the core layer 101 is made of $ZrO_2$—$Al_2O_3$. The core layer 101 has a content of zirconia more than the plurality of transition layers.

Correspondingly, the plurality of surface layers of the ceramic substrate according to the present disclosure are ceramics made of pure $Al_2O_3$, and each of the core layer 101 and the plurality of transition layers is ceramics made of $ZrO_2$—$Al_2O_3$. The core layer 101 has a content of zirconia higher than the transition layer. So, on one hand, the ceramic substrate may take advantage of high thermal conductivity of ceramics of $Al_2O_3$, and high strength and high toughness of ceramics of $ZrO_2$—$Al_2O_3$. On the other hand the ceramic substrate has a content of zirconia increasing from the surface layer to the core layer, thus the sintering shrinkage thereof may increase correspondingly, which may improve the density of the ceramic substrate and further lead to the high strength and high toughness of the ceramic substrate. The thickness of the ceramic substrate can be further decreased, thus the ceramic substrate can be greatly used in the power module.

In some embodiments, the core layer 101 has the chemical composition of 10 wt %<$ZrO_2$≤20 wt % and 80 wt %≤$Al_2O_3$<90 wt %, and each of the transition layers (e.g., the upper transition layer 301 and the lower transition layer 302) has a chemical composition of 0 wt %<$ZrO_2$≤10 wt % and 90 wt %≤$Al_2O_3$<100 wt %. The ceramic with such structure has a content gradient of zirconia from the core layer 101 to the plurality of surface layers. In one embodiment, the plurality of surface layers have a zirconia content of zero, the plurality of transition layers have a zirconia content of about zero to about 10 wt %, and the core layer 101 has a zirconia content of about 10 wt % to about 20 wt %. Along with the increasing of the content of zirconia, the sintering shrinkage of the ceramics of $ZrO_2$-$Al_2O_3$ is also increasing. Thus the sintering shrinkage of the ceramic substrate according to the present disclosure is increasing from the plurality of surface layers to the core layer 101, which may cause a compressive stress to the entire ceramic substrate from inside to outside, and is advantageous to the densification of the ceramic substrate. Thus the strength and the toughness of the ceramic substrate may be higher than the traditional ceramic substrate made of $Al_2O_3$.

In another embodiment, the core layer 101 has the chemical composition of 20 wt %<$ZrO_2$≤40 wt %, 60 wt %≤$Al_2O_3$<80 wt %, and each of the transition layers (e.g., the upper transition layer 301 and the lower transition layer 302) has a chemical composition of 10 wt %<$ZrO_2$≤20 wt %, 80 wt %≤$Al_2O_3$<90 wt %. Similarly, the ceramic with such structure has a content gradient of zirconia from the core layer 101 to the plurality of surface layers. In one embodiment, the plurality of surface layers have a zirconia content of zero, the plurality of transition layers have a zirconia content of about 10 wt % to about 20 wt %, and the core layer 101 has a zirconia content of about 20 wt % to about 40 wt %. Along with the increasing of the content of zirconia, the sintering shrinkage of the ceramics of $ZrO_2$-$Al_2O_3$ is also increasing. Thus the sintering shrinkage of the ceramic substrate according to the present disclosure is increasing from the plurality of surface layers to the core layer 101, which may cause a compressive stress to the entire ceramic substrate from inside to outside, and is advantageous to the densification of the ceramic substrate. Thus the strength and the toughness of the ceramic substrate may be higher than the traditional ceramic substrate made of $Al_2O_3$.

In one embodiment, the ceramic substrate includes the core layer 101, the plurality of transition layers and the plurality of surface layers without any boundary therebetween, thereby forming a complete integral ceramic substrate. In one embodiment, there is not any special limit to the thickness of the core layer 101, the plurality of transition layers and the plurality of surface layers. In some embodiments, each of the upper transition layer 301, the lower transition layer 302, the upper surface layer 201, the lower surface layer 202 and the core layer 101 has a same thickness. In other embodiments, the thickness of the layers may be different.

In some embodiments, the number of the plurality of transition layers may be more than two. Thus the plurality of transition layers may be of a multilayered structure, and the content of zirconia is increasing from outside to inside of the ceramic substrate, which may further improve the densification.

Following the present disclosure will be further described by way of examples that the plurality of transition layers are of a four-layer structure but without limits, in which the numbers of the upper transition layers and the lower transition layers are both two.

Figure 5:
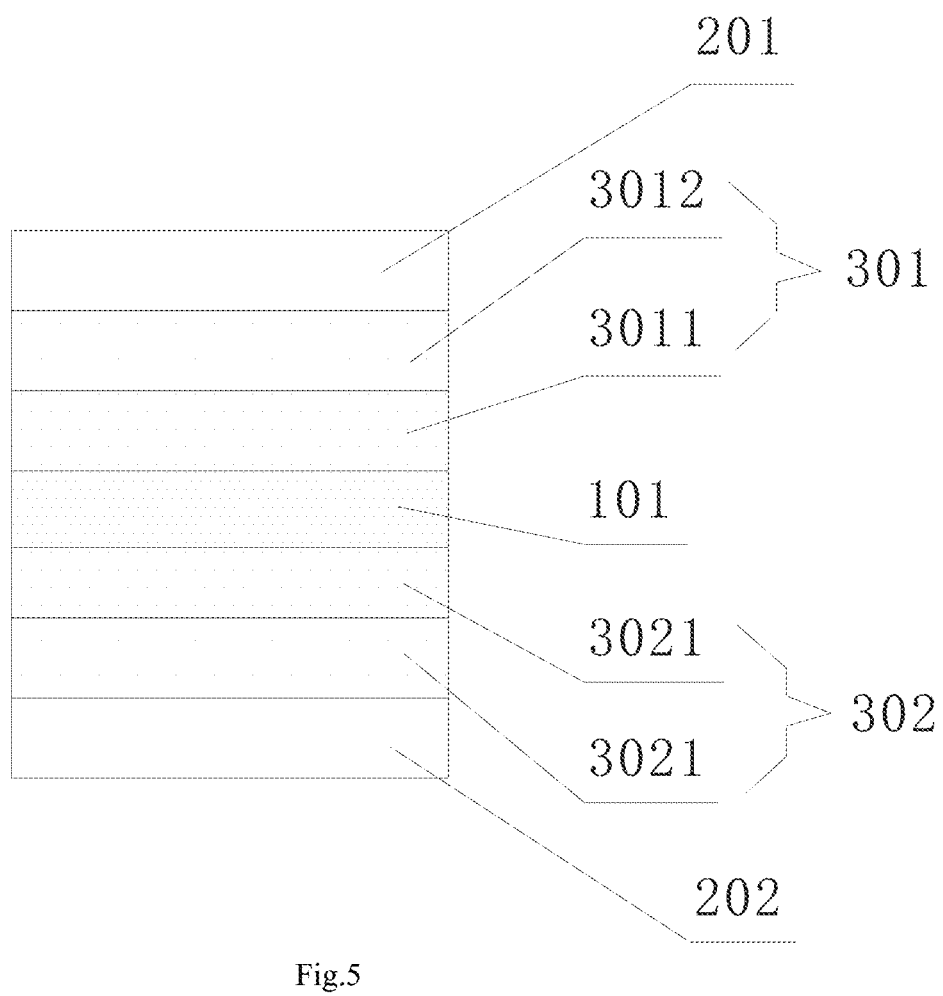
FIG. 5 is a schematic view showing the ceramic substrate S8 according to Embodiment 8 of the present disclosure.

In some embodiments, as can be seen in FIG. 5, the transition layers include a first upper transition layer 3011, a second upper transition layer 3012, a first lower transition layer 3021, and a second lower transition layer 3022.

The first upper transition layer 3011 is located on the upper surface of the core layer 101, and the second upper transition layer 3012 is located between the first upper transition layer 3011 and the upper surface layer 201. The first lower transition layer 3021 is located on the lower surface of the core layer 101, and the second lower transition layer 3022 is located between the first lower transition layer 3021 and the lower surface layer 202.

The second upper transition layer 3012 has a content of zirconia less than the first upper transition layer 3011, and the second lower transition layer 3022 has a content of zirconia less than the first lower transition layer 3021.

In some embodiments, each of the second upper transition layer 3012 and the second lower transition layer 3022 has a same chemical composition of 0 wt %<$ZrO_2$≤10 wt % and 90 wt %≤$Al_2O_3$<100 wt %. Meanwhile, each of the first upper transition layer 3011 and the first lower transition layer 3021 has a same chemical composition of 10 wt %<$ZrO_2$≤20 wt % and 80 wt %≤$Al_2O_3$<90 wt %. The core layer 101 has the chemical composition of 20 wt %<$ZrO_2$≤40 wt % and 60 wt %≤$Al_2O_3$<80 wt %. At this time, the ceramic with such structure has a content gradient of zirconia from the core layer 101 to the plurality of surface layers. In one embodiment, the plurality of surface layers have a zirconia content of zero. Each first transition layer (e.g., the first upper transition layer 3011 and the first lower transition layer 3021) has a zirconia content of zero to about 10 wt %, each second transition layer (e.g., the second upper transition layer 3011 and the second lower transition layer 3021) has a zirconia content of 10 wt % to about 20 wt %, and the core layer 101 has a zirconia content of about 20 wt % to about 40 wt %. Along with the increasing of the content of zirconia, the sintering shrinkage of the ceramics of $ZrO_2$-$Al_2O_3$ is also increasing. Thus the sintering shrinkage of the ceramic substrate according to the present disclosure is increasing from the plurality surface layers to the core layer 101, which may cause a compressive stress to the entire ceramic substrate from inside to outside, and is advantageous to the densification of the ceramic substrate. Thus the strength and the toughness of the ceramic substrate are higher than the traditional ceramic substrate made of $Al_2O_3$.

In some embodiments, there are not any special limits to the thickness of the core layer 101, the plurality of transition layers and the plurality of surface layers. In some embodiments, each of the first upper transition layer 3011, the second upper transition layer 3012, the first lower transition layer 3021, the second lower transition layer 3022, the upper surface layer 201, the lower surface layer 202 and the core layer 101 has a same thickness. In some embodiments, the total thickness of the plurality of transition layers is larger than either of the core layer 101 or the plurality of surface layers, but the performance of the ceramic substrate is not adversely affected.

Similarly, the number of the upper transition layers and the lower transition layers may also be three or more, without special limits, so long as the upper transition layers and the lower transition layers are symmetrically located on both surfaces of the core layer. Thus the larger the number of the transition layers is, the more uniform the content gradient of zirconia is distributed.

As mentioned above, the ceramic substrate according to embodiments of the present disclosure, possessing a high strength and a high toughness without poison, can be widely used in the power module. And, in addition to the high strength and high toughness of the ceramic substrate, the thickness thereof may be decreased, which may decrease the size of the DBC substrate. In some embodiments, the ceramic substrate has a total thickness of about 0.2 mm to about 0.4 mm, without special limits. Embodiments of the present disclosure also provide a method for manufacturing the above-mentioned ceramic substrate. The method includes steps of: providing a green body of the core layer and a plurality of green bodies of the surface layers; stacking all of the green bodies according to an order of: surface layer-core layer-surface layer; and isostatic pressing, then debinding and sintering.

In some embodiments, the step of providing all green bodies is performed by tape casting. The equipment and process conditions used for tape casting are well known to those skilled in the related art, without special limits, so long as the ceramic slurry used for casting molding is appropriate.

As mentioned above, the core layer 101 is made of $ZrO_2$—$Al_2O_3$. In some embodiments, the green body of the core layer is manufactured with a first ceramic slurry containing zirconia, aluminia, a binder, a dispersant, a plasticizer, and a solvent. Each surface layer is made of pure $Al_2O_3$.

In some embodiments, the plurality of green bodies of the surface layers are manufactured with a second ceramic slurry containing alumina, a binder, a dispersant, a plasticizer and a solvent.

According to embodiments of the present disclosure, the ceramic substrate further includes a plurality of transition layers. Thus the method according to embodiments of the present disclosure further includes a step of providing a plurality of green bodies of transition layers, then stacking all of the green bodies according to an order of: surface layer-transition layer-core layer-transition layer-surface layer, and isostatic pressing, debinding and sintering.

As mentioned above, each transition layer is also made of $ZrO_2$—$Al_2O_3$. In some embodiments, the plurality of green bodies of the transition layers are manufactured with a third ceramic slurry containing zirconia, alumina, a binder, a dispersant, a plasticizer and a solvent.

In some embodiments, each ceramic slurry used to manufacture respective green body contains the binder, the dispersant, the plasticizer and the solvent. These components are well known to those skilled in the art, without special limits.

In one embodiment, the difference between the above-mentioned ceramic slurries is that: the second ceramic slurry used to manufacturing the plurality of surface layers contains no $ZrO_2$, while the first and third ceramic slurries used to manufacturing the core layer 101 and the plurality of transition layers, respectively, both contain $ZrO_2$, but the contents of $ZrO_2$ therebetween are different. In one embodiment, each transition layer has a content of $ZrO_2$ less than the core layer.

In one embodiment, when there are more than one transition layers between the core layer 101 and one surface layer, the difference between each ceramic slurry used to manufacture each transition layer is just that: the contents of $ZrO_2$ thereof are different.

In some embodiments, the binder used in each ceramic slurry is independently at least one selected from a group consisting of polyvinyl butyral (short for PVB) and polyvinyl alcohol.

In some embodiments, the dispersant used in each ceramic slurry is independently at least one selected from a group consisting of castor oil, triolein, phosphate esters, menhaden oil, and triethanolamine.

In some embodiments, the plasticizer used in each ceramic slurry is independently at least one selected from a group consisting of dibutyl phthalate, polyethylene glycol and glycerol.

In some embodiments, the solvent used in each ceramic slurry is independently at least one selected from a group consisting of toluene, xylene, ethanol and butanone.

In one embodiment, the binder, the dispersant, the plasticizer and the solvent used in each ceramic slurry can be the same, or different from each other, without special limits. In order to facilitate all layers forming an integral structure after debinding and sintering, in an alternative embodiment, all ceramic slurry contain the same binder, the same dispersant, the same plasticizer and the same solvent.

The method for manufacturing each ceramic slurry is well known to those skilled in the related art, without special limits. In some embodiments, the method for manufacturing each ceramic slurry includes: mixing all the ceramic powders (e.g. $ZrO_2$ and/or $Al_2O_3$), the solvent and the dispersant, milling them in a planetary ball mill for about 3 h to about 5 h, then adding the binder and the plasticizer for further milling for about 5 h to about 10 h, adding the defoaming agent for further milling for about 1 h, and defoaming for about 0.5 h under vacuum to obtain the ceramic slurry used for casting molding.

In would be understood by the skilled that, the ceramic powders used for manufacturing the plurality of surface layers contain only $Al_2O_3$, and the ceramic powders used for manufacturing the core layer and the plurality of transition layers both contain $ZrO_2$ and $Al_2O_3$.

In some embodiments, the ceramic powder of $Al_2O_3$ can be purchased from Shawo Corporation JP, having an average diameter of about 0.5 μm to about 0.6 μm. The ceramic powder of $ZrO_2$ can be purchased from Tosoh Corporation JP, with a type of 3Y-TZP, having an average diameter of about 0.5 μm to about 0.6 μm.

As mentioned above, the defoaming agent is used to remove the air bubbles in the ceramic slurry, thus reducing the holes in the green body. The defoaming agent is well known to those skilled in the related art, without special limits. For example, the defoaming agent may use butanol.

In some embodiments, the tape casting can be performed by steps of: casting the ceramic slurry in a release film by a casting machine, with a casting speed of the casting machine of about 1.5 m/min to about 2 m/min, and the distance of the casting blade is about 80 μm to about 120 μm; and then drying. The drying temperature is divided into four stages: first stage, at room temperature for about 30 min; second stage, at about 45° C. to about 50° C. for about 15 min; third stage, at about 55° C. to about 60° C. for about 15 min; and fourth stage, at about 65° C. to about 70° C. for about 30 min. After drying, a green body with a certain thickness can be obtained. The thickness of the green body can be selected according to certain requirements.

According to the method of the present disclosure, the green bodies can then be cut into suitable size according to certain requirements, and then may be stacked according to a certain order for isostatic pressing. In some embodiments, all of the green bodies are stacked and laminated under an isostatic press, with a predetermined temperature of about 80° C. to about 90° C., and then the pressure is maintained at about 30 MPa for about 20 min.

According to the method of the present disclosure, all of the ceramic green bodies after stacking and pressing are put into a muffle furnace for debinding and sintering simultaneously, to obtain the ceramic substrate.

In some embodiments, the processing for debinding includes: heating from room temperature to about 600° C. at a speed of about 0.5° C./min to about 1° C./min; then heating from 600° C. to about 1600° C. at a speed of about 2° C./min to about 5° C./min, keeping the temperature of 1600° C. for about 3 h, then cooling to about 600° C. at a speed of about 5° C./min to about 10° C./min, and then natural cooling with the muffle furnace.

As mentioned above, the ceramic substrate according to the present disclosure shows a high strength and a high toughness, and the thickness thereof can be decreased. Thus the ceramic substrate can be widely used in the power module. Embodiments of a further aspect of the present disclosure provide a power module. The power module includes a direct bonded copper substrate, and the direct bonded copper substrate includes: a ceramic substrate, and a metal layer, located on a surface of the ceramic substrate. The ceramic substrate is the above-mentioned ceramic substrate or is obtained by the aforementioned method.

Hereinafter, the present disclosure will be described in details with reference to the following embodiments. The materials used in embodiments and comparative embodiments are commercially available, without special limits.

In the following embodiments, comparative embodiments and the tests, A represents $Al_2O_3$, and ZTAn represents $Al_2O_3$-n % $ZrO_2$, which has a chemical composition of: (100-n) wt % $Al_2O_3$, and n wt % $ZrO_2$. For example, ZTA10 represents $Al_2O_3$-10% $ZrO_2$, having the chemical composition of 90 wt % $Al_2O_3$, and 10 wt % $ZrO_2$.

Embodiment 1

The present Embodiment 1 provided a method for manufacturing a ceramic substrate. The method included following steps:

(1) providing all materials according to Table 2 for manufacturing a ceramic slurry of A; mixing the ceramic powders, solvent and dispersant in a planetary ball mill; milling for about 4 h; adding the binder and the plasticizer; milling for 8 h; adding the defoaming agent; milling for 1 h; and defoaming for 0.5 h, so that a ceramic slurry of A was obtained;

providing all materials according to Table 2 for manufacturing a ceramic slurry of ZTA10; mixing the ceramic powders, solvent and dispersant in a planetary ball mill; milling for about 4 h, adding the binder and the plasticizer; milling for 8 h; adding a defoaming agent; milling for 1 h; and defoaming for 0.5 h, so that a ceramic slurry of ZTA10 was obtained;

(2) casting the ceramic slurry of A on a release film by a casting machine, with a casting speed of the casting machine of 1.5 m/min, and a distance of the casting blade of 100 μm; drying. The drying temperature was divided into four stages: first stage, at room temperature for 30 min; second stage, at 50° C. for 15 min; third stage, at 60° C. for 15 min; and fourth stage, at 70° C. for 30 min. After drying step, a green body of A with a thickness of 0.06 mm was obtained.

Then a plurality of green bodies of A and a plurality of green bodies of ZTA10 were provided using the similar steps above.

(3) The plurality of green bodies obtained in Step (2) were cut into 200 mm×150 mm. Then 6 green bodies were stacked according to an order of: A-A-ZTA10-ZTA10-A-A, and then were laminated under an isostatic press with a predetermined temperature of 85° C., and the pressure was maintained at about 30 MPa for 20 min.

The green bodies after being stacked and pressed were put into a muffle furnace for debinding and sintering simultaneously, with a debinding processing including: heating from room temperature to 600° C. at a speed of about 1° C./min; then heating from 600° C. to 1600° C. at a speed of about 4° C./min, keeping the temperature of 1600° C. for 3 h, then cooling to 600° C. at a speed of 8° C./min, then natural cooling with the muffle furnace. A ceramic substrate S1 was obtained, which had a structure as shown in FIG. 1.

Embodiment 2

The present Embodiment 2 provided a method for manufacturing a ceramic substrate. The method included following steps:

(1) providing all materials according to Table 2 for manufacturing a ceramic slurry of A; mixing the ceramic powders, solvent and dispersant in a planetary ball mill; milling for about 4 h; adding the binder and the plasticizer; milling for 8 h; adding a defoaming agent; milling for 1 h; and defoaming for 0.5 h, so that a ceramic slurry of A was obtained;

providing all materials according to Table 2 for manufacturing a ceramic slurry of ZTA20; mixing the ceramic powders, solvent and dispersant in the planetary ball mill; milling for about 4 h; adding the binder and the plasticizer; milling for 8 h; adding a defoaming agent; milling for 1 h; and defoaming for 0.5 h, so that a ceramic slurry of ZTA20 was obtained;

(2) casting the ceramic slurry of A on a release film by a casting machine, with a casting speed of the casting machine of 1.5 m/min, and a distance of the casting blade of 100 μm; and drying. The drying temperature was divided into four stages: first stage, at room temperature for 30 min; second stage, at 50° C. for 15 min; third stage, at 60° C. for 15 min; and fourth stage, at 70° C. for 30 min. After drying step, a green body of A with a thickness of 0.06 mm was obtained.

Then a plurality of green bodies of A and a plurality of green bodies of ZTA20 were provided using the similar steps above.

(3) The plurality of green bodies obtained in Step (2) were cut into 200 mm×150 mm. Then 6 green bodies were stacked according to an order of: A-A-ZTA20-ZTA20-A-A, and then were laminated under an isostatic press with a predetermined temperature of 85° C., and the pressure is maintained at about 30 MPa for 20 min.

The green bodies after being stacked and pressed were put into a muffle furnace for debinding and sintering simultaneously, with a debinding processing including: heating from room temperature to 600° C. at a speed of about 1° C./min; then heating from 600° C. to 1600° C. at a speed of about 4° C./min, keeping the temperature of 1600° C. for 3 h, then cooling to 600° C. at a speed of 8° C./min, then natural cooling with the muffle furnace. A ceramic substrate S2 was obtained.

Embodiment 3

The present Embodiment 3 provided a method for manufacturing a ceramic substrate. The method included following steps:

(1) providing all materials according to Table 2 for manufacturing a ceramic slurry of A; mixing the ceramic powders, solvent and dispersant in a planetary ball mill; milling for about 4 h; adding the binder and the plasticizer; milling for 8 h; adding a defoaming agent; milling for 1 h; and defoaming for 0.5 h, so that a ceramic slurry of A was obtained;

providing all materials according to Table 2 for manufacturing a ceramic slurry of ZTA40; mixing the ceramic powders, solvent and dispersant in the planetary ball mill; milling for about 4 h; adding the binder and the plasticizer; milling for 8 h; adding a defoaming agent; milling for 1 h; and defoaming for 0.5 h, so that a ceramic slurry of ZTA40 was obtained;

(2) casting the ceramic slurry of A on a release film by a casting machine, with a casting speed of the casting machine of 1.5 m/min, and a distance of the casting blade of 100 μm; and drying. The drying temperature was divided into four stages: first stage, at room temperature for 30 min; second stage, at 50° C. for 15 min; third stage, at 60° C. for 15 min; and fourth stage, at 70° C. for 30 min. After drying step, a green body of A with a thickness of 0.06 mm was obtained.

Then a plurality of green bodies of A and a plurality of green bodies of ZTA40 were provided using the similar steps above.

(3) The plurality of green bodies obtained in Step (2) were cut into 200 mm×150 mm. Then 6 green bodies were stacked according to an order of: A-A-ZTA40-ZTA40-A-A, and then were laminated under an isostatic press with a predetermined temperature of 85° C., and the pressure was maintained at about 30 MPa for 20 min.

The green bodies after being stacked and pressed were put into a muffle furnace for debinding and sintering simultaneously, with a debinding processing including: heating from room temperature to 600° C. at a speed of about 1° C./min; then heating from 600° C. to 1600° C. at a speed of about 4° C./min, keeping the temperature of 1600° C. for 3 h, then cooling to 600° C. at a speed of 8° C./min, then natural cooling with the muffle furnace. A ceramic substrate S3 was obtained.

Embodiment 4

The present Embodiment 4 is substantially the same as Embodiment 3, with the exception that: in Embodiment 4 the plurality of green bodies manufactured by Step (2) were cut into 200 mm×150 mm. Then 4 green bodies were stacked according to an order of: A-ZTA40-ZTA40-A, and then were laminated under an isostatic press with a predetermined temperature of 85° C., and the pressure was maintained about 30 MPa for 20 min.

The green bodies after being stacked and pressed were put into a muffle furnace for debinding and sintering simultaneously, with a debinding processing including: heating from room temperature to 600° C. at a speed of about 0.5° C./min; then heating from 600° C. to 1600° C. at a speed of about 3° C./min, keeping the temperature of 1600° C. for 3 h, then cooling to 600° C. at a speed of 8° C./min, then natural cooling with the muffle furnace. A ceramic substrate S4 was obtained.

Embodiment 5

The present Embodiment 5 provided a method for manufacturing a ceramic substrate. The method included following steps:

(1) providing all materials according to Table 2 for manufacturing a ceramic slurry of A; mixing the ceramic powders, solvent and dispersant in a planetary ball mill; milling for about 4 h; adding the binder and the plasticizer; milling for 8 h; adding a defoaming agent; milling for 1 h; and defoaming for 0.5 h, so that a ceramic slurry of A was obtained;

providing all materials according to Table 2 for manufacturing a ceramic slurry of ZTA10; mixing the ceramic powders, solvent and dispersant in a planetary ball mill; milling for about 4 h; adding the binder and the plasticizer; milling for 8 h; adding a defoaming agent; milling for 1 h; and defoaming for 0.5 h, so that a ceramic slurry of ZTA10 was obtained;

providing all materials according to Table 2 for manufacturing a ceramic slurry of ZTA20; mixing the ceramic powders, solvent and dispersant in the planetary ball mill; milling for about 4 h; adding the binder and the plasticizer; milling for 8 h; adding a defoaming agent; milling for 1 h; and defoaming for 0.5 h, so that a ceramic slurry of ZTA20 was obtained;

(2) casting the ceramic slurry of A on a release film by a casting machine, with a casting speed of the casting machine of 1.5 m/min, and a distance of the casting blade of 100 μm; and drying. The drying temperature was divided into four stages: first stage, at room temperature for 30 min; second stage, at 50° C. for 15 min; third stage, at 60° C. for 15 min; and fourth stage, at 70° C. for 30 min. After drying step, a green body of A with a thickness of 0.06 mm was obtained.

Then a plurality of green bodies of A, a plurality of green bodies of ZTA10 and a plurality of green bodies of ZTA20 were obtained using the similar steps above.

(3) The plurality of green bodies were cut into 200 mm×150 mm. Then 6 green bodies were stacked according to an order of: A-ZTA10-ZTA20-ZTA20-ZTA10-A, and then were laminated under an isostatic press with a predetermined temperature of 85° C., and the pressure is maintained at about 30 MPa for 20 min.

The green bodies after being stacked and pressed were put into a muffle furnace for debinding and sintering simultaneously, with a debinding processing including: heating from room temperature to 600° C. at a speed of about 1° C./min; then heating from 600° C. to 1600° C. at a speed of about 4° C./min, keeping the temperature of 1600° C. for 3 h, then cooling to 600° C. at a speed of 8° C./min, then natural cooling with the muffle furnace. A ceramic substrate S5 was obtained, which had a structure as shown in FIG. 3.

Embodiment 6

The present Embodiment 6 is substantially the same as Embodiment 5, with the exception that: in Embodiment 6 the plurality of green bodies manufactured by Step (2) were cut into 200 mm×150 mm. Then 5 green bodies were stacked according to an order of: A-ZTA10-ZTA20-ZTA10-A, and then were laminated under an isostatic press with a predetermined temperature of 85° C., and the pressure is maintained at about 30 MPa for 20 min.

The green bodies after being stacked and pressed were put into a muffle furnace for debinding and sintering simultaneously, with a debinding processing including: heating from room temperature to 600° C. at a speed of about 0.5° C./min; then heating from 600° C. to 1600° C. at a speed of about 3° C./min, keeping the temperature of 1600° C. for 3 h, then cooling to 600° C. at a speed of 8° C./min, then natural cooling with the muffle furnace. A ceramic substrate S6 was obtained.

Embodiment 7

The present Embodiment 7 provided a method for manufacturing a ceramic substrate. The method included following steps:

(1) providing all materials according to Table 2 for manufacturing a ceramic slurry of A; mixing the ceramic powders, solvent and dispersant in a planetary ball mill; milling for about 4 h; adding the binder and the plasticizer; milling for 8 h; adding a defoaming agent; milling for 1 h; and defoaming for 0.5 h, so that a ceramic slurry of A was obtained;

providing all materials according to Table 2 for manufacturing a ceramic slurry of ZTA20; mixing the ceramic powders, solvent and dispersant in a planetary ball mill; milling for about 4 h; adding the binder and the plasticizer; milling for 8 h; adding a defoaming agent; milling for 1 h; and defoaming for 0.5 h, so that a ceramic slurry of ZTA20 was obtained.

providing all materials according to Table 2 for manufacturing a ceramic slurry of ZTA40; mixing the ceramic powders, solvent and dispersant in a planetary ball mill; milling for about 4 h; adding the binder and the plasticizer; milling for 8 h; adding a defoaming agent; milling for 1 h; and defoaming for 0.5 h, so that a ceramic slurry of ZTA40 was obtained;

(2) casting the ceramic slurry of A in a release film by a casting machine, with a casting speed of the casting machine of 1.5 m/min, and a distance of the casting blade of 100 μm; and drying. The drying temperature was divided into four stages: first stage, at room temperature for 30 min; second stage, at 50° C. for 15 min; third stage, at 60° C. for 15 min; and fourth stage, at 70° C. for 30 min. After drying step, a green body of A with a thickness of 0.06 mm was obtained.

Then a plurality of green bodies of A, a plurality of green bodies of ZTA20 and a plurality of green bodies of ZTA40 were obtained using the similar steps above.

(3) The plurality of green bodies obtained in Step (2) were cut into 200 mm×150 mm. Then 5 green bodies were stacked according to an order of: A-ZTA20-ZTA40-ZTA20-A, and then were laminated under an isostatic press with a predetermined temperature of 85° C., and the pressure was maintained at about 30 MPa for 20 min.

The green bodies after being stacked and pressed were put into a muffle furnace for debinding and sintering simultaneously, with a debinding processing including: heating from room temperature to 600° C. at a speed of about 1° C./min; then heating from 600° C. to 1600° C. at a speed of about 4° C./min, keeping the temperature of 1600° C. for 3 h, then cooling to 600° C. at a speed of 8° C./min, then natural cooling with the muffle furnace. A ceramic substrate S7 was obtained.

Embodiment 8

The present Embodiment 8 provided a method for manufacturing a ceramic substrate. The method included following steps:

(1) providing all materials according to Table 2 for manufacturing a ceramic slurry of A; mixing the ceramic powders, solvent and dispersant in a planetary ball mill; milling for about 4 h; adding the binder and the plasticizer;

milling for 8 h; adding a defoaming agent; milling for 1 h; and defoaming for 0.5 h, so that a ceramic slurry of A was obtained;

providing all materials according to Table 2 for manufacturing a ceramic slurry of ZTA20; mixing the ceramic powders, solvent and dispersant in a planetary ball mill; milling for about 4 h; adding the binder and the plasticizer; milling for 8 h; adding a defoaming agent; milling for 1 h; and defoaming for 0.5 h, so that a ceramic slurry of ZTA20 was obtained;

providing all materials according to Table 2 for manufacturing a ceramic slurry of ZTA40; mixing the ceramic powders, solvent and dispersant in a planetary ball mill; milling for about 4 h; adding the binder and the plasticizer; milling for 8 h; adding a defoaming agent; milling for 1 h; and defoaming for 0.5 h, so that a ceramic slurry of ZTA40 was obtained;

(2) casting the ceramic slurry of A on a release film by a casting machine, with a casting speed of the casting machine of 1.5 m/min, and a distance of the casting blade of 100 μm; and drying. The drying temperature was divided into four stages: first stage, at room temperature for 30 min; second stage, at 50° C. for 15 min; third stage, at 60° C. for 15 min; and fourth stage, at 70° C. for 30 min. After drying step, a green body of A with a thickness of 0.06 mm was obtained.

Then a plurality of green bodies of A, a plurality of green bodies of ZTA20 and a plurality of green bodies of ZTA40 were obtained using the similar steps above.

(3) The plurality of green bodies obtained in Step (2) were cut into 200 mm×150 mm. Then 7 green bodies were stacked according to an order of: A-ZTA10-ZTA20-ZTA40-ZTA20-ZTA10-A, and then were laminated under an isostatic press with a predetermined temperature of 85° C., and the pressure is maintained at about 30 MPa for 20 min.

The green bodies after being stacked and pressed were put into a muffle furnace for debinding and sintering simultaneously, with a debinding processing including: heating from room temperature to 600° C. at a speed of about 1° C./min; then heating from 600° C. to 1600° C. at a speed of about 4° C./min, keeping the temperature of 1600° C. for 3 h, then cooling to 600° C. at a speed of 8° C./min, then natural cooling with the muffle furnace. A ceramic substrate S8 was obtained, which had a structure as shown in FIG. 5.

Comparative Embodiment 1

The ceramic slurry of A and a plurality of green bodies of A were obtained by the same Steps (1) and (2), then the ceramic substrate DS1 was obtained by the following steps: the green body of A was cut into 200 mm×150 mm. Then 8 green bodies of A were stacked and laminated under an isostatic press with a predetermined temperature of 85° C., and the pressure is maintained at about 30 MPa for 20 min.

The green bodies after being stacked and pressed were put into a muffle furnace for debinding and sintering simultaneously, with a debinding processing including: heating from room temperature to 600° C. at a speed of about 1° C./min; then heating from 600° C. to 1600° C. at a speed of about 4° C./min, keeping the temperature of 1600° C. for 3 h, then cooling to 600° C. at a speed of 8° C./min, then natural cooling with the muffle furnace. A ceramic substrate DS1 was obtained.

TABLE 2

| Slurry | Ceramic powders/g | | Solvent/g | Dispersant/g | Binder/g | Plasticizer/g Dibutyl | Defoaming agent/g |
| | $Al_2O_3$ | $ZrO_2$ | Xylene | Castor oil | PVB | phthalate | Butanol |
| --- | --- | --- | --- | --- | --- | --- | --- |
| A | 200 | 0 | 110 | 2 | 22 | 11 | 0.05 |
| ZTA10 | 180 | 20 | 105 | 2 | 22 | 10 | 0.05 |
| ZTA20 | 160 | 40 | 100 | 2 | 20 | 10 | 0.05 |
| ZTA40 | 120 | 80 | 98 | 2 | 19 | 9 | 0.05 |

In the above Table 2, the ceramic powder of $Al_2O_3$ was purchased from Shawo Corporation JP, having an average diameter of about 0.5 μm to about 0.6 μm. The ceramic powder of $ZrO_2$ was purchased from Tosoh Corporation JP, with a type of 3Y-TZP, having an average diameter of about 0.5 μm to about 0.6 μm. The binder was PVB purchase from KURARAY, with a type of B30H. The dispersant was domestic castor oil, and the plasticizer was domestic dibutyl phthalate.

Tests

SEM

Figure 2:
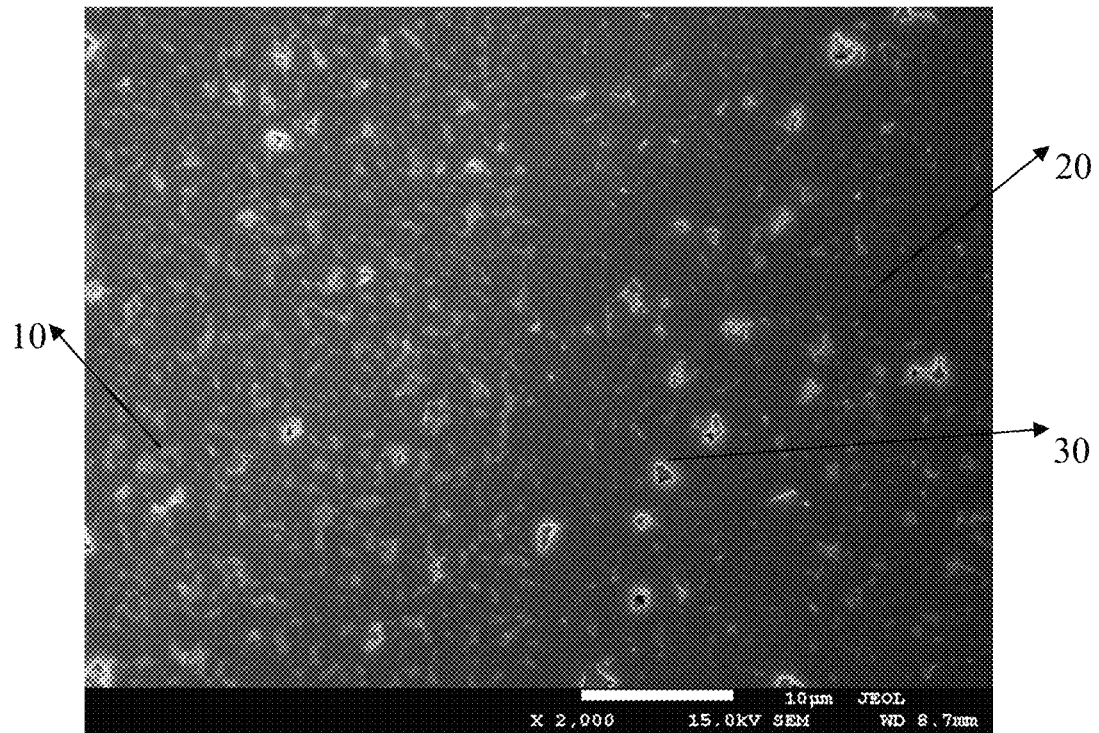
FIG. 2 is a SEM image of the ceramic substrate S1 according to Embodiment 1 of the present disclosure at the contact of the core layer and the surface layer, with a magnification of 2000 times.
Figure 4:
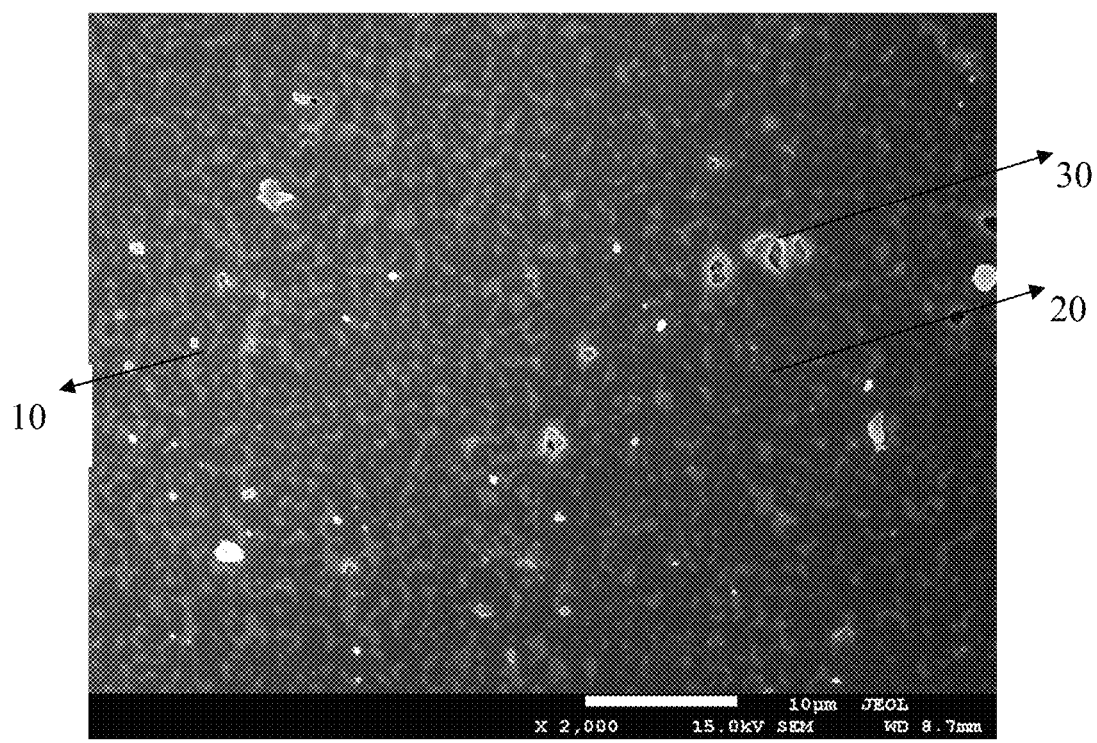
FIG. 4 is a SEM image of the ceramic substrate S5 according to Embodiment 5 of the present disclosure at the contact of the core layer and the surface layer, with a magnification of 2000 times.

The ceramic substrates S1 and S5 were tested with field emission scanning electronic microscopy at the end face, and the SEM images were shown in FIG. 2 and FIG. 4 respectively.

In FIG. 2 and FIG. 4, the bright portions are $ZrO_2$ 10, and the dark portions are $Al_2O_3$ 20. As can be seen from FIG. 2, the core layer was on the left part, and the surface layer was on the right part. There was some holes 30 in the ceramic substrate S1. The bright $ZrO_2$ was dispersed uniformly in the dark $Al_2O_3$ matrix in the core layer, and the surface layer was made of pure $Al_2O_3$. From the core layer to the surface layer, although the content of zirconia was different, there was no boundary between the core layer 101 and the surface layer, thus forming a complete integral ceramic substrate S1.

As can be seen from FIG. 4, the core layer was on the left part, and the transition layer was on the right part. There were some holes 30 in the ceramic substrate S5. Both the core layer and the transition layer contained $Al_2O_3$ and $ZrO_2$. The bright $ZrO_2$ was dispersed uniformly in the dark $Al_2O_3$ matrix both in the core layer and the transition layer, but the core layer had a $ZrO_2$ content more than the transition layer. From the core layer to the transition layer, although the content of zirconia was different, there was no boundary between the core layer 101 and the surface layer, thus forming a complete integral ceramic substrate S5, which was also similar to the transition layer and the surface layer.

Density

The ceramic substrates S1 to S8 and DS1 were tested by a method according to GBT 25995-2010.

Bending Strength

The ceramic substrates S1 to S8 and DS1 were tested by a method according to GBT 6569-2006.

Thermal Conductivity

The ceramic substrates S1 to S8 and DS1 were tested by a method according to ASTM E1461 by a thermal conductivity testing device LFA-447 at a temperature of about 25° C.

Thermal Resistance

Thermal resistance refers to a ratio of a temperature difference between two reference points to a heat transfer rate between the two reference points in a heat transfer path, $$Rth = \Delta T/q_x \quad (1)$$

wherein Rth refers to the thermal resistance between the two reference points, with a unit of °C./W or K/W, ΔT refers to the temperature difference between the two reference points, with a unit of °C., and $q_x$ refers to the heat transfer rate between the two reference points, with a unit of W.

A heat transfer model has a calculation formula of thermal resistance that:

$$Rth = L/(\lambda S) \quad (2)$$

wherein L refers to a heat transfer distance, with a unit of m, S refers to a cross-sectional area of the heat transfer path, with a unit of $m^2$, and λ refers to a thermal conductivity thereof, with a unit of W/(m·K).

Thus, the shorter the heat transfer distance, the larger the cross-sectional area of the heat transfer path, and the higher the thermal conductivity which is advantageous to the reduction of the thermal resistance, which requires well-designed package structures and appropriate materials. The results were shown in Table 3.

TABLE 3

| Ceramic substrate | Order | Thickness/ mm | Density/ g/cm³ | Bending strength/ Mpa | Thermal conductivity/ W/(m · K) | Thermal resistance/ K/W |
|---|---|---|---|---|---|---|
| S1 | A-ZTA10-A | 0.32 | 4.01 | 430 | 20.30 | $15.8 \times 10^6$/S |
| S2 | A-ZTA20-A | 0.31 | 4.05 | 511 | 19.20 | $16.2 \times 10^6$/S |
| S3 | A-ZTA40-A | 0.29 | 4.21 | 540 | 16 | $18.1 \times 10^6$/S |
| S4 | A-ZTA40-A | 0.22 | 4.35 | 600 | 13.1 | $16.8 \times 10^6$/S |
| S5 | A-ZTA10-ZTA20-ZTA10-A | 0.30 | 4.09 | 450 | 19.26 | $15.6 \times 10^6$/S |
| S6 | A-ZTA10-ZTA20-ZTA10-A | 0.26 | 4.05 | 480 | 20.00 | $13.0 \times 10^6$/S |
| S7 | A-ZTA20-ZTA40-ZTA20-A | 0.25 | 4.26 | 542 | 15.30 | $16.3 \times 10^6$/S |
| S8 | A-ZTA10-ZTA20-ZTA40-ZTA20-ZTA10-A | 0.34 | 4.22 | 420 | 17.10 | $19.9 \times 10^6$/S |
| DS1 | $Al_2O_3$ | 0.40 | 3.94 | 290 | 22 | $18.2 \times 10^6$/S |

As can be seen from Table 3, the ceramic substrates S1 to S8 obtained by the method according to the present disclosure had higher bending strength than the traditional ceramic substrate DS1 made of $Al_2O_3$. The thermal conductivities thereof were slightly lower than DS1, but the thickness thereof were smaller than DS1. The thermal resistances thereof were similar to or slightly lower than DS1. Thus, the ceramic substrate according to the present disclosure can be widely used in the power module.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that changes, alternatives, and modifications all falling into the scope of the claims and their equivalents may be made in the embodiments without departing from spirit and principles of the disclosure.

What is claimed is:

1. A ceramic substrate, comprising:
    a core layer including zirconia ($ZrO_2$) and alumina ($Al_2O_3$), wherein the core layer has a chemical composition of 0 wt %<$ZrO_2$≤40 wt % and 60 wt %≤$Al_2O_3$<100 wt %;
    a plurality of transition layers each including zirconia and alumina, wherein the plurality of transition layers is disposed on an upper surface and a lower surface of the core layer, and each of the plurality of transition layers has a content of zirconia less than that of the core layer; and
    a plurality of surface layers disposed on the upper surface and the lower surface of the core layer and made of $Al_2O_3$, wherein each of the plurality of transition layers is located between one of the plurality of surface layers and the core layer.

2. The ceramic substrate of claim 1, wherein the core layer has the chemical composition of 0 wt %<$ZrO_2$≤20 wt % and 80 wt %≤$Al_2O_3$<100 wt %.

3. The ceramic substrate of claim 2, wherein the plurality of surface layers comprises:
    an upper surface layer, located on the upper surface of the core layer; and
    a lower surface layer, located on the lower surface of the core layer,
    wherein each of the upper surface layer, the lower surface layer, and the core layer has a same thickness.

4. The ceramic substrate of claim 3, wherein the ceramic substrate has a total thickness of about 0.2 mm to about 0.4 mm.

5. The ceramic substrate of claim 1, wherein the core layer has the chemical composition of 10 wt %<$ZrO_2$≤20 wt % and 80 wt %≤$Al_2O_3$<90 wt %, and each of the plurality of transition layers has a chemical composition of 0 wt %<$ZrO_2$≤10 wt % and 90 wt %≤$Al_2O_3$<100 wt %.

6. The ceramic substrate of claim 1, wherein the core layer has the chemical composition of 20 wt %<$ZrO_2$≤40 wt % and 60 wt %≤$Al_2O_3$<80 wt %, each of the plurality of transition layers has a chemical composition of 10 wt %<$ZrO_2$≤20 wt % and 80 wt %≤$Al_2O_3$<90 wt %.

7. The ceramic substrate of claim 3, wherein the plurality of transition layers comprises:
an upper transition layer, located between the core layer and the upper surface layer; and
a lower transition layer, located between the core layer and the lower surface layer,
wherein each of the upper transition layer, the lower transition layer, the upper surface layer, the lower surface layer, and the core layer has a same thickness.

8. The ceramic substrate of claim 3, wherein the plurality of transition layers comprises:
a first upper transition layer, located on the upper surface of the core layer;
a second upper transition layer, located between the first upper transition layer and the upper surface layer;
a first lower transition layer, located on the lower surface of the core layer; and
a second lower transition layer, located between the first lower transition layer and the lower surface layer;
wherein the second upper transition layer has a content of zirconia less than that of the first upper transition layer, and the second lower transition layer has a content of zirconia less than that of the first lower transition layer.

9. The ceramic substrate of claim 8, wherein each of the second upper transition layer and the second lower transition layer has a same chemical composition of 0 wt %<$ZrO_2$≤10 wt % and 90 wt %≤$Al_2O_3$<100 wt %;
each of the first upper transition layer and the first lower transition layer has a same chemical composition of 10 wt %<$ZrO_2$≤20 wt % and 80 wt %<$Al_2O_3$<90 wt %; and
the core layer has the chemical composition of 20 wt %<$ZrO_2$≤40 wt % and 60 wt %≤$Al_2O_3$<80 wt %.

10. The ceramic substrate of claim 8, wherein each of the first upper transition layer, the second upper transition layer, the first lower transition layer, the second lower transition layer, the upper surface layer, the lower surface layer and the core layer has a same thickness.

11. A power module, comprising a direct bonded copper substrate, and the direct bonded copper substrate comprising:
a ceramic substrate of claim 1; and
a metal layer, located on a surface of the ceramic substrate.

12. A power module comprising a direct bonded copper substrate, and the direct bonded copper substrate comprising:
a ceramic substrate comprising:
a core layer including zirconia (ZrO) and alumina ($Al_2O_3$), wherein the core layer has a chemical composition of 0 wt %<$ZrO_2$≤40 wt % and 60 wt %≤$Al_2O_3$<100 wt %;
a plurality of transition layers each including zirconia and alumina, wherein the plurality of transition layers is disposed on an upper surface and a lower surface of the core layer, and each of the plurality of transition layers has a content of zirconia less than that of the core layer;
a plurality of surface layers disposed on the upper surface and the lower surface of the core layer and made of $Al_2O_3$, wherein each of the plurality of transition layers is located between one of the plurality of surface layers and the core layer; and
a metal layer located on a surface of the ceramic substrate.

* * * * *